United States Patent [19]

Edwards et al.

[11] Patent Number: 5,138,326
[45] Date of Patent: Aug. 11, 1992

[54] MAGNETIC FIELD GENERATING ASSEMBLY AND METHOD

[75] Inventors: Donald Edwards; Raymond Tietz; Dennis J. Kountz; Jeffrey D. Cohen; Che-Hsiung Hsu, all of Wilmington, Del.; Alan G. A. M. Armstrong; Ian L. McDougall, both of Oxon, England

[73] Assignees: Oxford Medical Limited, Oxford, England; E. I. Du Pont de Nemours & Company, Wilmington, Del.

[21] Appl. No.: 476,405

[22] PCT Filed: Sep. 19, 1989

[86] PCT No.: PCT/GB89/01095

§ 371 Date: Jul. 27, 1990

§ 102(e) Date: Jul. 27, 1990

[87] PCT Pub. No.: WO90/04258

PCT Pub. Date: Apr. 19, 1990

[30] Foreign Application Priority Data

Oct. 14, 1988 [WO] World Int. Prop. O. ..... GB8800861

[51] Int. Cl.[5] ................ G01V 3/00; H01F 1/00
[52] U.S. Cl. ........................... 324/319; 335/216
[58] Field of Search ............ 324/309, 319, 320; 335/216, 299; 505/1, 705, 844, 879; 29/596, 599

[56] References Cited

U.S. PATENT DOCUMENTS

| | | | |
|---|---|---|---|
| 4,176,291 | 11/1979 | Rabinowitz | 505/878 |
| 4,190,817 | 2/1980 | Rabinowitz | 29/599 |
| 4,641,119 | 2/1987 | Moore | 324/319 |
| 4,656,447 | 4/1987 | Keim et al. | 324/320 |
| 4,694,269 | 9/1987 | Burnett et al. | 29/599 |
| 4,717,437 | 1/1988 | Blaugher et al. | 335/216 |

Primary Examiner—Hezron E. Williams
Assistant Examiner—Louis M. Arana
Attorney, Agent, or Firm—Staas & Halsey

[57] ABSTRACT

A magnetic field generating assembly including self-contained modules formed from relatively high temperature superconducting material. A magnetic flux guide, such as a yoke, is positioned relative to the modules so that magnetic flux generated by the modules is coupled into the flux guide.

12 Claims, 3 Drawing Sheets

MAGNETIC FIELD GENERATING ASSEMBLY AND METHOD

BACKGROUND OF THE INVENTION

1. Field of the Invention

The invention relates to a magnetic field generating assembly and a method of constructing such an assembly.

2. Description of the Background Art

Magnets for generating high strength magnetic fields are used in a wide variety of applications including nuclear magnetic resonance (NMR). In the case of whole body imaging and the like, large magnet structures are required leading to very high costs. One of the significant reasons for these high costs is the need to provide superconducting material which historically has comprised copper cooled to liquid helium temperatures. This requires the provision of efficient cryostats and the like.

Low temperature superconductivity is difficult to maintain in large structures because of the small "packets" of heat that can raise the temperature of the conductor above the critical temperature for superconductivity. Elegant forms of the conductor design have been created to minimise electromagnetic sources of heat arising within the conductor during operation. However, as magnets become larger, and the systems in which they are incorporated more complex, support engineering to avoid macroscopic heat pulses from structural movement and heat leaks from the environment become costly.

Recently, relatively high temperature superconducting materials have been discovered. By "relatively high temperature" we mean temperatures higher than for example liquid nitrogen temperatures (77K) at which the materials superconduct.

In order to duplicate conventional approaches using coils of wire it would be necessary to produce long lengths of wire made from the high temperature superconducting materials. In practice, this is not possible since the high temperature materials only carry useful current densities if they are made by very specialized fabrication processes, particularly those that apply to thin films. There would be no possibility of providing many kilometers of thin film like material to wind the magnet conventionally.

SUMMARY OF THE INVENTION

In accordance with one aspect of the present invention, a magnetic field generating assembly comprises at least one magnetic field generating module of relatively high temperature superconducting material; and a magnetic flux guide positioned relative to the module so that magnetic flux generated by the module is coupled into the guide and conveyed to a position remote from the module.

We have devised a new concept in which the relatively high temperature superconducting materials are used in efficient, small elements or modules which are assembled with a magnetic flux guide so as to construct a useful magnet structure. This enables thin film formation techniques to be used and avoids the problem of the structural frailty of the materials.

Each module can be considered as a source of magneto-motive force (mmf) so that when the modules are combined, the summed mmf can be obtained and be usefully directed.

The assembly can be arranged in a variety of ways to achieve different generator configurations. For example, there may be provided a number of modules and associated flux guides arranged spaced apart in a two dimensional array so as to generate magnetic fields in the same sense and to project into a working region a magnetic field of controlled characteristics.

In another example, a generally U-shaped flux guide may be provided with one or more modules at each end and arranged so as to generate a magnetic field of controlled characteristics in the mouth of the U. In this configuration, which can be realised as a C-magnet, the modules will usually be arranged to face each other across a gap with the magnetic field of controlled characteristics being generated in the gap.

In another configuration, a pair of magnetic flux guides are provided with one or more modules positioned adjacent one end of the guides while magnetic fluxes are conveyed by the guides to their other ends so as to generate a magnetic field of controlled characteristics in a working region defined between those other ends. This arrangement is particularly suitable for constructing a pincer magnet.

Typically, the or each magnetic flux guide will be made of iron.

Typically, the modules are in the form of solenoids (with or without magnetic cores) and these may be arranged either in a plane or in "crates" one above the other.

It should be noted that where more than one module is provided, these need not necessarily generate fields of the same strength. Furthermore, where the module has a core, this could be filled by the magnetic flux guide itself. Furthermore, the modules could be powered in series or in parallel and can be powered so that different energy densities exist in the modules so that higher currents and energies can be obtained where the field of the total array is lowest, in order to maximize the overall efficiency of the array.

In one important application of the invention, the magnetic field generated in the working volume is substantially uniform. This enables the assembly to be used in nuclear magnetic resonance apparatus and for example the modules may be positioned to enable at least a part and preferably all, of a human body to be positioned within the working volume.

The modules may be formed from a wire or tape formed by thin film processing and typically the material comprises a ceramic.

It should be noted that in operation at the high field levels obtained using these high temperature superconducting materials, electro-magnetic forces are very large. This is particularly severe if a winding is configured to enclose the working volume and has, therefore, substantial dimensions, for example, two or three meters. The modules can be much more easily engineered to be involved with the high electro-magnetic forces that would be encountered in the magnet taking advantage of the intrinsic performance of high temeperature superconducting materials.

In accordance with a second aspect of the present invention, a method of constructing a magnetic field generating assembly comprises arranging at least one magnetic field generating module of relatively high temperature superconducting material relative to a magnetic flux guide so that when a working current flows in the or each module a resultant magnetic field is generated in a working volume defined by the flux guide; and positioning the assembly in a magnetic field having a predetermined form to cause the or each module to take up a working current such that upon removal of the assembly from the magnetic field, the magnetic field is duplicated in the working volume.

This method enables a magnetic field of a particular form to be "memorized" by the modules.

BRIEF DESCRIPTION OF THE DRAWINGS

Some examples of assemblies and methods according to the invention will now be described with reference to the accompanying drawings, in which.

DESCRIPTION OF THE PREFERRED EMBODIMENTS

Figure 1A:
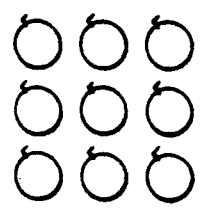
FIG. 1A illustrates schematically current flow in an array of modules and FIG. 1B the equivalent circuit.
Figure 1B:
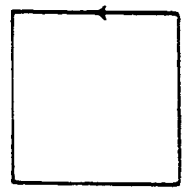
Figure 2:
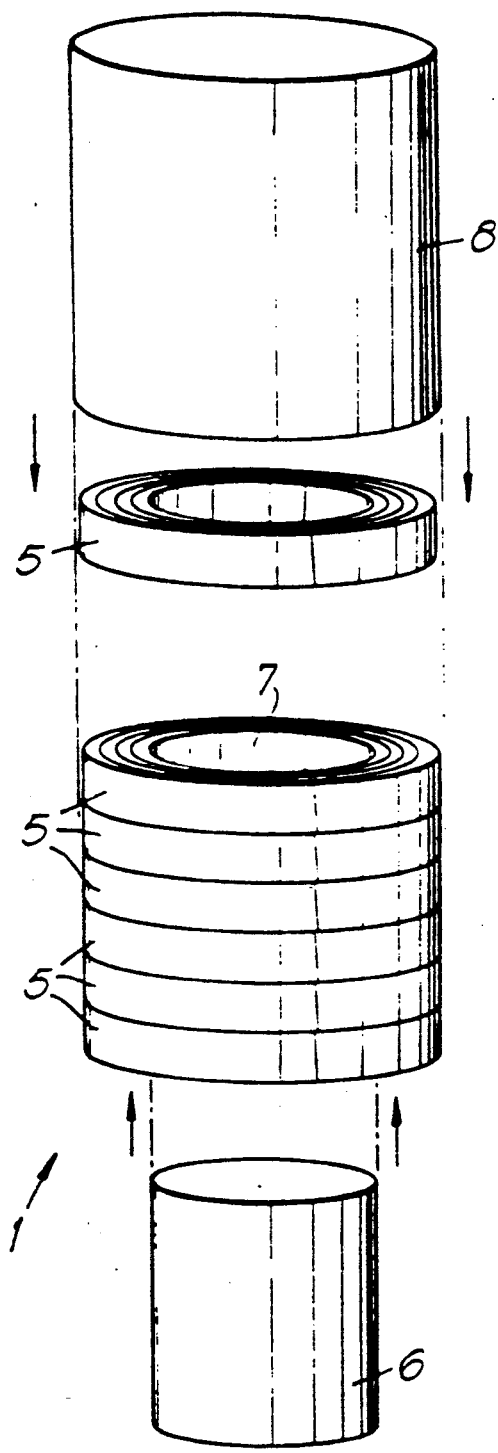
FIG. 2 illustrates a module in more detail.

The principle behind the invention is illustrated in FIG. 1 in which an array of nine modular solenoids made from high temperature superconducting material is shown. This is equivalent to the circuit shown in FIG. 1B. It should be noted that each module must possess the same number of ampere-turns as the required equivalent circuit. In the case of the C-magnet described with reference to FIG. 3, the number of ampere-turns needed to drive flux across the air gap of the C-magnet is:

$$NI = \frac{Bg}{\mu_o}$$

where:
NI = ampere-turns
g = air gap, meters
$\mu_o$ = permeability constant, $4 \times 10^{-7}$
B = flux density, Tesla The construction of a module 1 is shown in more detail in FIG. 2. Each module 1 is formed from a number of spirally wound sections of a high temperature superconducting material in the form of a tape, the sections 5 being stacked together concentrically. A suitable material is $YBa_2Cu_3O_7$ made by Du Pont. Electrical contacts are made with the sections 5 via an inner copper cylinder 6 which is mounted in the bore 7 of the module and an outer copper cylinder 8 which contacts and surrounds the sections 5.

In practice, each module is immersed in a liquid nitrogen bath so as to reduce the temperature of the material sufficiently to achieve superconduction. For clarity, the cryostat arrangement has been omitted from the drawings.

The arrangement shown in FIG. 1 can be adapted to produce homogeneous magnetic fields in working volumes positioned at a variety of locations. Commonly, the working volume is at the geometric centre of the solenoid but other arrangements are possible as described, for example, in EP-A-0160350. A further arrangement is described in EP-A-0186998.

Figure 3:
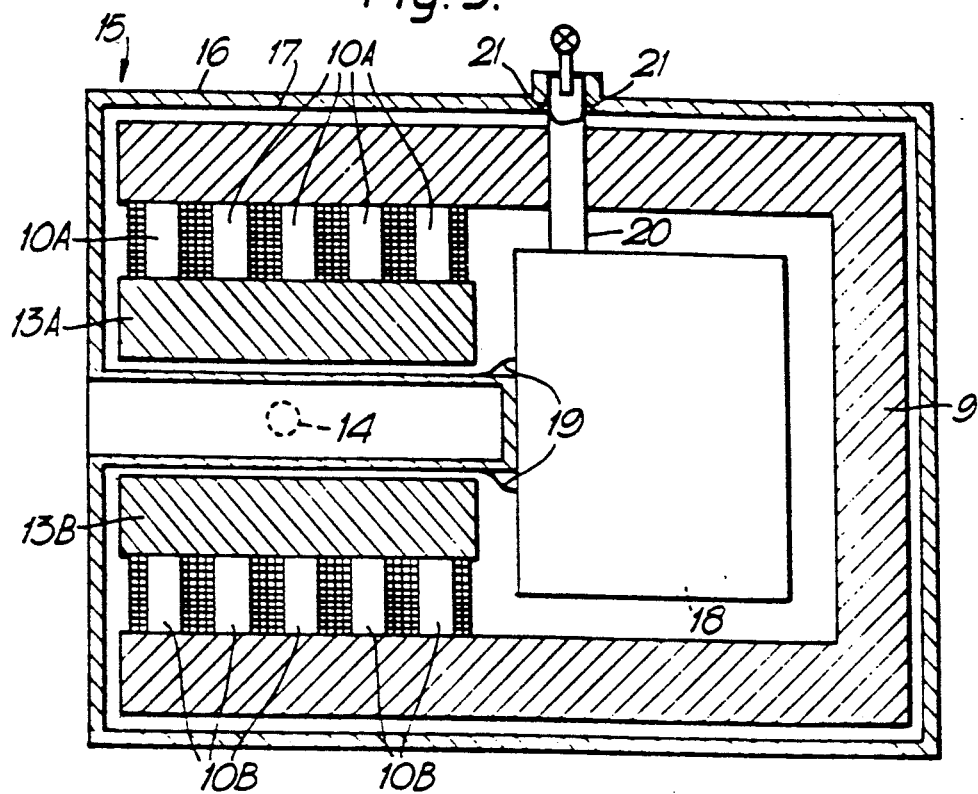
FIG. 3 illustrates an example of a C-shaped magnet.

FIG. 3 illustrates C-shaped magnet based on the use of modules. In this case, a C-shaped iron yoke 9 is provided with a set of iron cored, high temperature superconducting modules 10A mounted under one arm of the yoke 9 and a second set of iron core modules 10B mounted against the other arm of the yoke 9. A pair of iron plates 13A, 13B are positioned adjacent the modules 10A, 10B to define pole faces. In this example, a working volume 14 is defined between the pole faces 13A, 13B center at the centre of symmetry of the modules 10A, 10B.

The assembly so far described is housed in a cryostat 15 having an outer vacuum jacket 16, a 77° K. radiation shield 17, and a liquid nitrogen tank 18. Thermal links 19 connect the radiation shield 17 with the tank 18. The tank is filled through an inlet conduit 20 extending through the yoke 9, the shield 17 to which it is thermally connected via links 21 and the vacuum jacket 16.

In order to achieve a magnetic field in the working volume 14 of 0.2 T where the air gap g is 0.3 meters, the formula set out above indicates that the total number of ampere-turns required is $4.77 \times 10^4$.

It has been found that this field can be achieved if each module (having an iron core) has $2.46 \times 10^4$ ampere-turns while the maximum field seen by the modules is 0.15 T.

Since the flux density is at saturation level (2.16 T) in the iron near the coil, we can conclude that an iron cross-section equal to 50% of the pole face area is about right for the modules. We will assume that each module will require the same ampere-turns as a single large equivalent coil, $2.5 \times 10^4$ ampere-turns.

If 50% of the area occupied by modules is to be iron, what space does this leave for windings? We can envision at least two ways that the modules can be packed together: a circular array or a hexagonal close-packed array. It can be shown that for the circular array the maximum module packing density in the pole-face area is about 76%, and for the hexagonal array, it is about 75%. We will assume, then, that the module packing density can be 75%. Thus, with iron occupying 50% of the pole-face area, we are left with 25% for the windings, i.e.:

$$A_c = 2A_w$$

where:
$A_c$ = cross section area of iron cores
$A_w$ = circular cross-section area of windings
Therefore, it can be shown that:

$$d_w = [(3/2)d_c^2]^{\frac{1}{2}} \text{ or } d_c = [(\tfrac{2}{3})d_w^2]^{\frac{1}{2}}$$

where:
$d_w$ = outer diameter of winding
$d_c$ = diameter of iron core

And the thickness of the winding, $$t_w = \frac{d_w - d_c}{2}.$$

For a module of length, $L_m$, the conductor area, $A_{con} = t_w \times L_m$. Thus, the average current density over the coil area, $$J_{ave} = \frac{NI}{A_{con}}$$

If we assume that the HTSC material can only occupy some portion $P_{sc}$, of the winding cross-section and that the superconductor can only be operated at some portion, $P_{cc}$, of its critical current, we can define the required critical current density, $J_c$, for the superconductor as:

$$J_c = \frac{J_{ave}}{P_{sc} \times P_{cc}}$$

The above relationships have been used to calculate the results shown in the Table below.

| | | | | | | | | |
|---|---|---|---|---|---|---|---|---|
| Ampere-turns, NI | 25000 | | | | | | | |
| HISC Packing Fraction, $P_{sc}$ | 0.7 | | | | | | | |
| Operating to Critical Current Ratio, $P_{cc}$ | 0.7 | | | | | | | |
| Pole-Face Diameter, $D_f$-cm | 9.0 | | | | | | | |
| Module Length, $L_m$-cm | 16 | 30 | 16 | 30 | 16 | 30 | 16 | 30 |
| Outer Winding Diameter $d_w$-cm | 12.86 | 12.86 | 10 | 10 | 8.18 | 8.18 | 6.92 | 6.92 |
| Iron Core Diameter $d_c$-cm | 10.50 | 10.50 | 8.16 | 8.16 | 6.68 | 6.68 | 5.65 | 5.65 |
| Winding Thickness $t_w$-cm | 1.18 | 1.18 | 0.92 | 0.92 | 0.75 | 0.75 | 0.63 | 0.63 |
| Winding Cross-section Area, $A_w$-cm$^2$ | 18.88 | 35.40 | 14.68 | 27.53 | 12.01 | 22.52 | 10.16 | 19.05 |
| Average Winding Current Density, $J_{ave}$-A/cm$^2$ | 1324 | 706 | 1703 | 908 | 2082 | 1110 | 2461 | 1312 |
| Required Critical Current Density, $J_c$-A/cm$^2$ | 2703 | 1441 | 3475 | 1854 | 4249 | 2266 | 5022 | 2679 |
| Number of Modules per Pole-Face Array | 37 | 37 | 61 | 61 | 91 | 91 | 127 | 127 |

Module diameters ($d_w$) have been chosen so that an exact odd number of modules will fit across the pole-face, as required by either of the module arrays discussed above. The two module lengths, $L_m$, were chosen arbitrarily. Note the values chosen for $P_{sc}$ and $P_{cc}$.

Figure 4:
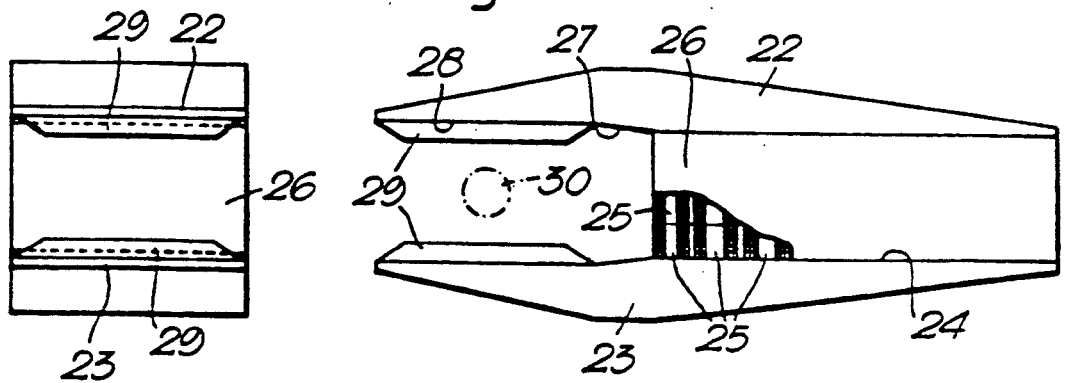
FIG. 4 illustrates an example of a pincer magnet.

FIG. 4 illustrates a pincer magnet having two iron yokes 22, 23 which define a first, bore section 24 in which are stacked a series of the modules 25 some of which can be seen in the drawing, the modules being surrounded by a cryostat 26. The iron yokes 22, 23 are tapered outwardly at 27 to define a wider bore section 28 having parallel sides, the facing surfaces of the sides of the yoke 22, 23 being provided with iron pole pieces 29. The pole pieces define a working region 30. In use, the stacked modules 25 are energised (by a means not shown) to generate a magnetic field which is coupled via the yokes 22, 23 to the pole pieces 29 so that a magnetic field is generated within the working region 30. The precise construction of the cryostat 26 has been omitted since this will be of a conventional form. Similarly, the power supply and other conventional features have been omitted from both FIGS. 3 and 4 although it will be readily apparent to a person skilled in the art how these can be provided.

Figure 5:
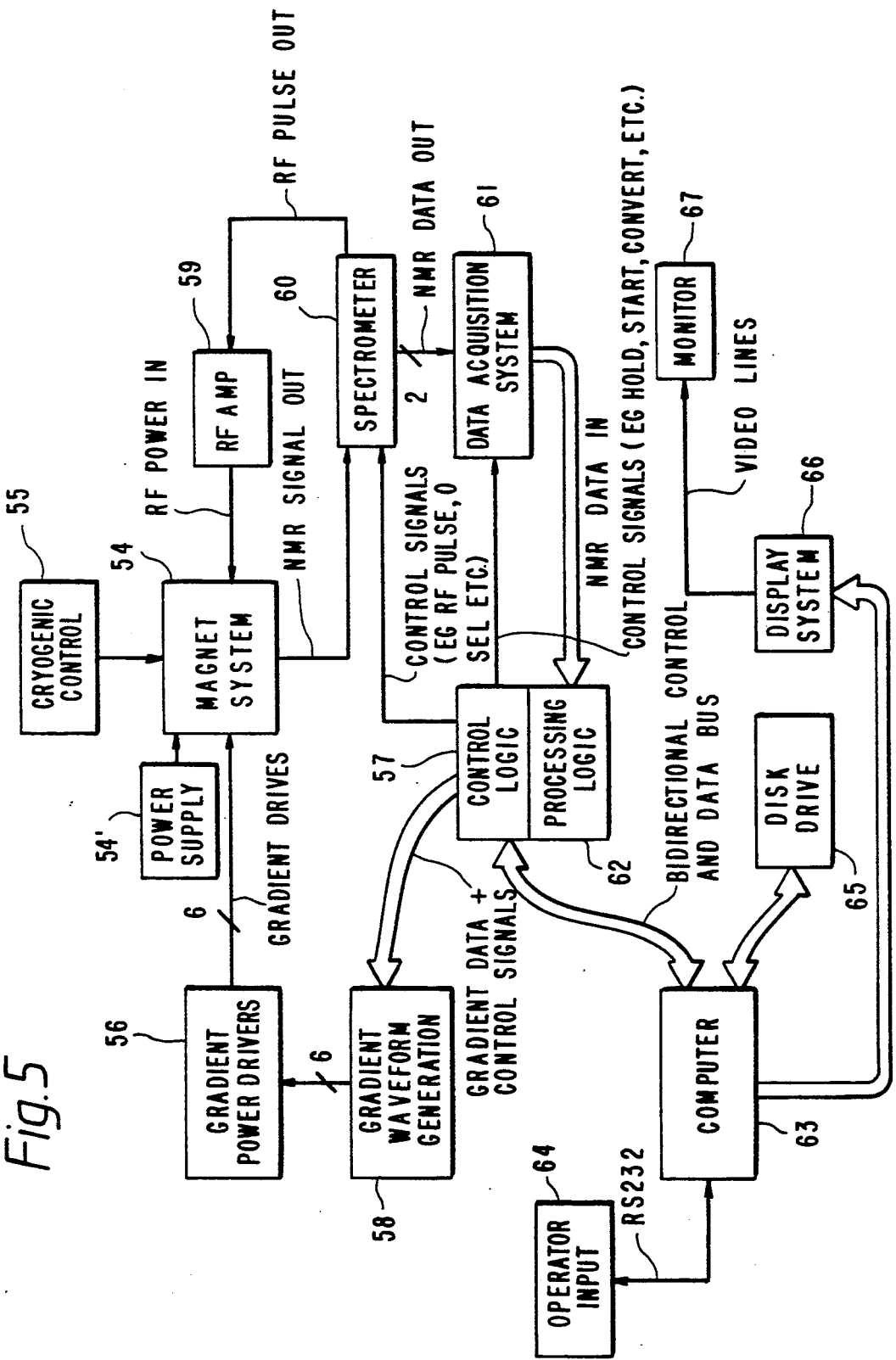
FIG. 5 is a block diagram of nuclear magnetic resonance imaging apparatus.

One of the most important applications for the magnet assemblies just described is in NMR imaging apparatus. FIG. 5 illustrates in block diagram form such apparatus which is otherwise of a conventional form. The apparatus comprises a magnet system 54 including one of the magnet assemblies previously described and incorporating a power supply 54'. The cryostat is connected to a conventional cryogenic control system 55.

A number of gradient coils (not shown) are mounted on a former around the homogeneous region generated by the magnet assembly so that different gradients of magnetic field can be set up through the homogeneous region to enable NMR imaging experiments to be carried out. These gradient coils are not superconducting coils and are also of a conventional form. They are driven by respective power drivers 56 controlled by control logic 57 via a waveform generator 58. Coils (not shown) for generating and receiving RF energy are mounted on the same former as the gradient coils, the RF transmitter being connected to an amplifier 59 which is connected to a spectrometer 60. NMR data from the spectrometer 60 passes to a data acquisition system 61 which is controlled by the control logic 57. Data from the system 61 then passes to processing logic 62.

The overall control of the NMR apparatus is provided by a computer 63 which is connected via a conventional RS 232 interface to an operator input station 64. Information for the computer 63 is stored in a disc drive 65 while the results of the imaging experiments are passed by the computer 63 to a display system 66 which can display "slices" through the patient's body on a monitor 67.

In one method for energizing the system, the assembly shown in FIG. 3 or FIG. 4 can be positioned within a magnetic field having particular, desirable characteristics so that the field is impressed on the short-circuited superconducting modules. At this stage, the field is "memorized" by the modules which, when the assembly is removed from the magnetic field, will continue to generate a simulation of that field and this avoids the need for separate energization of the modules.

We claim:
1. A magnetic field generating assembly, comprising:
   at least one array of magnetic field generating modules of relatively high temperature superconducting material, wherein each of the modules comprises
   an inner cylinder made of conductive material,
   an annular cylinder made of conductive material, said annular cylinder substantially surrounding said inner cylinder, and
   a coil made of relatively high temperature superconducting material and being spirally wound around said inner cylinder between said inner cylinder and said annular cylinder, one end of said coil being electrically connected to said inner cylinder and another end of said coil being electrically connected to said annular cylinder; and a magnetic flux guide positioned relative to the modules so that magnetic flux generated by the modules is coupled into the guide and conveyed to a working volume remote from the modules.

2. A magnetic field generating assembly, comprising:

an array of magnetic field generating modules, each of said magnetic field generating modules includes a core made of copper, a coil made of a relatively high temperature superconducting material and being wound around said core, and an annular cylinder made of copper, said annular cylinder substantially surrounding said core and said coil, one end of said coil being electrically connected to said core and another end of said coil being electrically connected to said annular cylinder; and a magnetic flux guide positioned relative to said array of said magnetic field generating modules so that magnetic flux generated by said magnetic field generating modules is coupled into said magnetic flux guide and conveyed to a position remote from said array of magnetic field generating modules.

3. An assembly according to claim 1, wherein the magnetic field generated in the working volume is substantially uniform.

4. An assembly according to claim 1, wherein the assembly comprises a C-shaped magnet.

5. An assembly according to claim 1, wherein the assembly comprises a pincer magnet.

6. An assembly according to claim 1, wherein the modules are positioned to enable at least a part of the human body to be positioned within the working volume.

7. An assembly according to claim 1, wherein the relatively high temperature superconducting material is a ceramic.

8. An assembly according to claim 2, wherein the magnetic field generated in the working volume is substantially uniform.

9. An assembly according to claim 2, wherein the assembly comprises a C-shaped magnet.

10. An assembly according to claim 2, wherein the assembly comprises a pincer magnet.

11. An assembly according to claim 2, wherein the modules are positioned to enable at least a part of a human body to be positioned within the working volume.

12. An assembly according to claim 2, wherein the relatively high temperature superconducting material is a ceramic.

* * * * *